(12) United States Patent
Bittner et al.

(10) Patent No.: US 10,303,063 B2
(45) Date of Patent: *May 28, 2019

(54) PROJECTION EXPOSURE APPARATUS WITH AT LEAST ONE MANIPULATOR

(71) Applicant: Carl Zeiss SMT GmbH, Oberkochen (DE)

(72) Inventors: Boris Bittner, Roth (DE); Norbert Wabra, Werneck (DE); Martin von Hodenberg, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/827,586

(22) Filed: Nov. 30, 2017

(65) Prior Publication Data

US 2018/0173100 A1     Jun. 21, 2018

Related U.S. Application Data

(63) Continuation of application No. 14/792,758, filed on Jul. 7, 2015, now Pat. No. 9,846,367, which is a (Continued)

(30) Foreign Application Priority Data

Mar. 29, 2012   (DE) .................. 10 2012 205 096

(51) Int. Cl.
*G03F 7/20*     (2006.01)

(52) U.S. Cl.
CPC ............ *G03F 7/7015* (2013.01); *G03F 7/706* (2013.01); *G03F 7/70058* (2013.01);
(Continued)

(58) Field of Classification Search
CPC ............ G03F 7/70058; G03F 7/70525; G03F 7/70891
(Continued)

(56) References Cited

U.S. PATENT DOCUMENTS 5,913,199 A    6/1999  Dueck et al.
6,416,913 B1   7/2002  Suzuki
(Continued)

FOREIGN PATENT DOCUMENTS

CN    1550904 A    12/2004
CN    1828431 A     9/2006
(Continued)

OTHER PUBLICATIONS

B. Bakushinsky et al., "Iterative Methods for Ill-Posed Problems: An Introduction (Inverse and Ill-Posed Problems", De Gruyter, 2010, Chapters 4 and 5, pp. 23-43.
(Continued)

*Primary Examiner* — Hung Nguyen
(74) *Attorney, Agent, or Firm* — Fish & Richardson P.C.

(57) ABSTRACT

A projection exposure apparatus for microlithography includes a projection lens which includes a plurality of optical elements for imaging mask structures onto a substrate during an exposure process. The projection exposure apparatus also includes at least one manipulator configured to change, as part of a manipulator actuation, the optical effects of at least one of the optical elements within the projection lens by changing a state variable of the optical element along a predetermined travel. The projection exposure apparatus further includes an algorithm generator configured to generate a travel generating optimization algorithm, adapted to at least one predetermined imaging parameter, on the basis of the at least one predetermined imaging parameter.

20 Claims, 2 Drawing Sheets

Related U.S. Application Data continuation of application No. 13/790,957, filed on Mar. 8, 2013, now Pat. No. 9,170,497.

(52) U.S. Cl.
CPC ...... *G03F 7/70258* (2013.01); *G03F 7/70525* (2013.01); *G03F 7/70891* (2013.01)

(58) Field of Classification Search
USPC .................................. 355/52, 53, 55, 67–71
See application file for complete search history.

(56) References Cited

U.S. PATENT DOCUMENTS

| 7,414,730 | B2 | 8/2008 | Sun et al. |
|---|---|---|---|
| 9,170,497 | B2 * | 10/2015 | Bittner ................ G03F 7/70258 |
| 2002/0012109 | A1 | 1/2002 | Suzuki et al. |
| 2002/0036758 | A1 | 3/2002 | De Mol et al. |
| 2003/0035090 | A1 | 2/2003 | Iami et al. |
| 2003/0071986 | A1 | 4/2003 | Geh et al. |
| 2004/0227107 | A1 | 11/2004 | Cox et al. |
| 2005/0190350 | A1 | 9/2005 | Shinoda |
| 2006/0008716 | A1 | 1/2006 | Jeunink et al. |
| 2006/0068301 | A1 | 3/2006 | Hirukawa |
| 2008/0316447 | A1 | 12/2008 | Yabu et al. |
| 2009/0153828 | A1 | 6/2009 | Yabu |
| 2009/0214962 | A1 | 8/2009 | Mishima |
| 2010/0039629 | A1 | 2/2010 | Xalter et al. |
| 2010/0231883 | A1 | 9/2010 | Dodoc et al. |
| 2011/0013171 | A1 | 1/2011 | Mueller et al. |
| 2011/0235015 | A1 | 9/2011 | Dengel et al. |
| 2012/0002184 | A1 | 1/2012 | Bader |
| 2013/0258302 | A1 | 10/2013 | Bittner et al. |
| 2016/0033873 | A1 | 2/2016 | Bittner et al. |

FOREIGN PATENT DOCUMENTS

| CN | 101510051 A | 8/2009 |
|---|---|---|
| CN | 101821678 A | 9/2010 |
| CN | 101978323 A | 2/2011 |
| CN | 102033315 A | 4/2011 |
| CN | 102033438 A | 4/2011 |
| CN | 102203675 A | 9/2011 |
| CN | 102353653 A | 2/2012 |
| EP | 1569033 A2 | 8/2005 |
| JP | H05-291111 A | 11/1993 |
| JP | 2000-114145 A | 4/2000 |
| JP | 2003-215424 A | 7/2003 |
| JP | 2005-243953 A | 9/2005 |
| JP | 2007-165845 A | 6/2007 |
| JP | 2007-189179 A | 7/2007 |
| JP | 2007-281079 A | 10/2007 |
| JP | 2011-082311 | 4/2011 |
| TW | 201005447 | 1/2010 |
| WO | WO 96/02040 | 1/1996 |
| WO | WO 2010/034674 | 4/2010 |

OTHER PUBLICATIONS

Chinese Office Action, with translation thereof, for CN Appl No. 201310101939.2, dated Dec. 1, 2014.

Chinese Office Action, with translation thereof, for CN Appl No. 201310101939.2, dated Jul. 3, 2015.

Japanese Office Action, with translation thereof, for JP Appl No. 2013-085203, dated Apr. 2, 2014.

Taiwanese Office Action, with translation thereof, for TW Appl No. 102111263, dated May 23, 2014.

Fukuhara et al., "Solutions with precise prediction for thermal aberration error in low-k1 immersion lithography", *Proc. of SPIE*, vol. 8683, pp. 86830U-1-86830U-7 (2013).

Mori et al., "Imaging Application tools for extremely low-k1 ArF immersion lithography", *Proc. of SPIE*, vol. 8683, 86830A-1-86830A-9 (2013).

Nakashima et al., "Thermal Aberration Control in Projection Lens", *Proc. of SPIE*, vol. 6924, pp.69241V-1-69241V-9 (2008).

Ohmura et al., "An aberration control of projection optics for multi-patterning lithography", *Proc. of SPIE*, vol. 7973, pp. 79730W-1-79730W-11 (Mar. 23, 2011).

Sheven Boyd et al., "Convex Optimization", Cambridge University Press (2004), Chapter 4.4, pp. 152-153, Chapter 4.6, p. 167, Chpater 4.7, pp. 174-184, Chapters 11.1-11.5, pp. 561-569 and Chapter 11.8, pp. 615-620.

Walter Alt, "Nichtlineare OPtimierung", Vieweg, 2002, Chapter 8, pp. 291-305. (English translation attached).

Wikipedia article "Evolutionäre Algorithmus", http://de/.wikipedia.org/wiki/Evolution%C3%A4rerAlgorithmus, edited Apr. 2011, with English Wikipedia edition "Evolutionary Algorithm", http://en.wikipedia.org/w/index.php?titile=Evolutionary_algorithm&oldid=422101522.

Wikipedia article "Simulierte Abkühlung", http://de.wikipedia.org/wild/SimulierteAbk%C3%BChlung edited May 5, 2011, with English Wikipedia edition "Simulated annealing", http://en.wikipedia.org/w/index.php?title=Simulated_annealing&oldid=485692448 edited Apr. 5, 2012.

The First Office Action from the Chinese Patent Office for Chinese Application No. 201710942715.2 by Examiner Le Zhang dated Mar. 21, 2019.

* cited by examiner

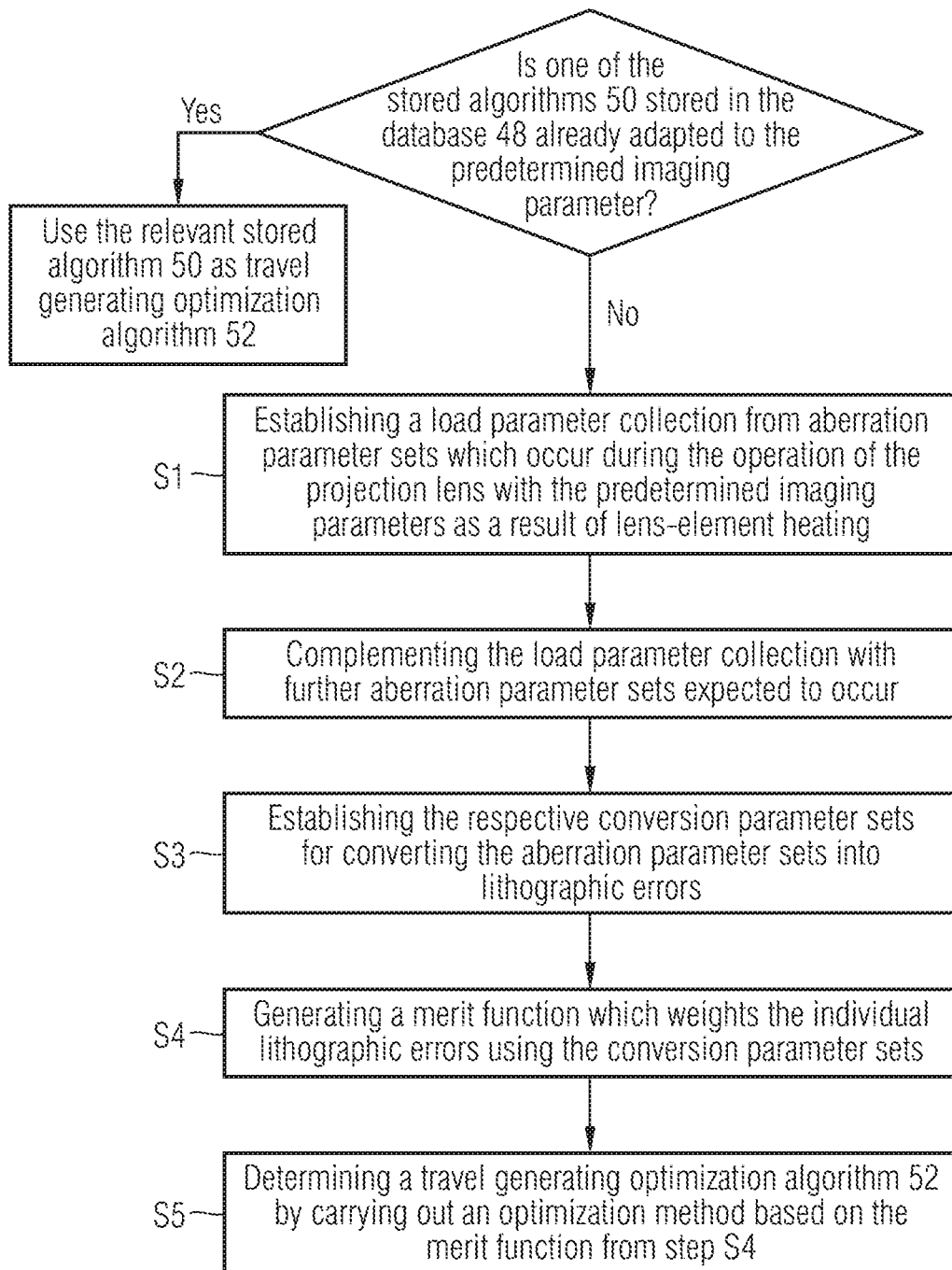

PROJECTION EXPOSURE APPARATUS WITH AT LEAST ONE MANIPULATOR

CROSS-REFERENCE TO RELATED APPLICATION

This application is a continuation of, and claims priority under 35 USC 120 to, U.S. application Ser. No. 14/792,758, filed Jul. 7, 2015, now U.S. Pat. No. 9,846,367, which is a continuation of U.S. application Ser. No. 13/790,957, filed Mar. 8, 2013, now U.S. Pat. No. 9,170,497, which is a continuation of, and claims benefit under 35 U.S.C. § 119 of German patent application DE 10 2012 205 096.5, filed Mar. 29, 2012, the entire contents of which are hereby incorporated by reference in their entirety.

FIELD

The disclosure relates to a projection exposure apparatus for microlithography and a method for operating such a projection exposure apparatus. A projection exposure apparatus for microlithography is used to create structures on a substrate in the form of a semiconductor wafer during the production of semiconductor elements. The projection exposure apparatus includes a projection lens with a plurality of optical elements for imaging mask structures on the wafer during an exposure process.

BACKGROUND

To ensure very precise imaging of the mask structures on the wafer, a projection lens with the fewest possible wavefront aberrations is desired. Projection lenses are therefore equipped with manipulators which render it possible to correct wavefront aberrations by changing the state of individual optical elements of the projection lens. Examples of such a state change include a change in position in one or more of the six rigid body degrees of freedom of the relevant optical element, an application of heat and/or coldness to the optical element, and a deformation of the optical element. Usually, the aberration characteristic of the projection lens is measured at regular intervals and, if desired, changes in the aberration characteristic are determined between the individual measurements by simulation. Thus, for example, lens-element heating effects can be taken into account in calculations. The terms "lens heating", "lens-element warming", "mirror heating" and "mirror warming" are also used synonymously for "lens-element heating". The manipulator changes to be carried out to correct the aberration characteristic are calculated using a travel generating optimization algorithm, which is also referred to as "manipulator changing model".

"Travel" is understood to mean a change in a state variable of an optical element, effected via manipulator actuation, for the purpose of changing the optical effects thereof. Such travel defined by changing a state variable of the optical element is specified by intended change variables of the manipulator. By way of example, the manipulation can consist of a displacement of the optical element in a specific direction, but also, for example, of a local or two-dimensional loading of the optical element with heat, coldness, forces, light of a specific wavelength or currents. By way of example, the intended change variable can, in the case of a displacement, define a path length to be travelled or an angular range to be travelled.

The desire for continuous miniaturization of the structures to be imaged and for increasing the throughput lead to the situation where the aberration characteristic cannot, in general, be corrected sufficiently satisfactorily in a conventional manner by manipulators, neither during operation nor over the service life of a projection exposure apparatus. In this case, "sufficiently satisfactorily" is understood to mean that the uncorrected residual aberration characteristic leads to a sufficient imaging quality for a multiplicity of usage configurations. Here, a usage configuration should be understood to mean a combination of a mask with an illumination setting used for imaging the same.

It was found to be desirable to set the residual aberration characteristic in view of the processed usage configurations so that important structures, in particular so-called core-region structures (described in more detail below), are imaged very precisely and so that the residual structures, i.e. the peripheral structures, are imaged less precisely but still sufficiently precisely. This is possible, among other reasons, because core-region structures and peripheral structures scan different regions of the wavefronts and the peripheral structures pose significantly lower demands on the scanned wavefront region.

It is known to use travel generating optimization algorithms which usually solve unrestricted quadratic optimization problems in regularized fashion, usually via matrix multiplication by a single preceding calculation of the inverse. To regularize so-called "ill-posed problems", use is made in particular of singular value decomposition with singular-value cut-off or Tikhonov regularization. Details are disclosed in, for example, "Iterative Methods for Ill-Posed Problems: An Introduction," Inverse and Ill-Posed Problems, B. Bakushinsky, Mihail Y. Kokurin and Alexandra Smirnova, De Gruyter, 2010, chapters 4 and 5, pages 23-43. Here, the respective user configuration can, as a matter of principle, not be taken or not be sufficiently taken into account.

SUMMARY

The disclosure provides a projection exposure apparatus and a method for operating such a projection exposure apparatus with which imaging aberrations occurring during an exposure process are able to be corrected with great accuracy within short time intervals. The imaging aberrations occurring during an exposure process are desirably corrected within short time intervals with the accuracy that is involved for the successful imaging process with respect to the different demands for core-region structures and peripheral structures.

In one aspect, the disclosure provides a projection exposure apparatus for microlithography including a projection lens which includes a plurality of optical elements for imaging mask structures onto a substrate during an exposure process. The apparatus also includes at least one manipulator configured to change, as part of a manipulator actuation, the optical effects of at least one of the optical elements within the projection lens by changing a state variable of the optical element along a predetermined travel. The apparatus further includes an algorithm generator configured to generate a travel generating optimization algorithm, adapted to at least one predetermined imaging parameter, on the basis of the at least one predetermined imaging parameter. The at least one imaging parameter includes structure information with respect to mask structures to be imaged during a subsequent exposure process and/or structure information with respect to an angular distribution of exposure radiation radiated onto the mask structures during the subsequent exposure process. The apparatus also includes a travel establishing device configured to establish at least one travel for a manipulator actuation via the travel generating optimization algorithm. As mentioned above, the travel defines a change in a state variable of the optical element. This change is effected by the manipulator actuation. The travel establishing device is therefore configured to establish at least one travel for a change in the state variable of the optical element effected by manipulator actuation via the travel generating optimization algorithm.

In other words, a travel generating optimization algorithm is first of all generated in a targeted fashion when the projection exposure apparatus is operated. The algorithm is adapted to at least one imaging parameter which is predetermined for the subsequent exposure process. This specifically adapted optimization algorithm, also referred to as "manipulator change model", is then used to calculate travel corrections for at least one manipulator of the projection lens.

Such a manipulator is configured, as part of a manipulator actuation, to change the optical effects of at least one of the optical elements within the projection lens by changing a state variable of the optical element along a predetermined travel. By way of example, such a manipulator actuation can include a positional change of the optical element in one of the six rigid body degrees of freedom, an application of heat and/or coldness to the optical element, and/or a deformation of the optical element. The predetermined travel along which such a manipulator actuation is brought about is defined by the manipulator actuation of successively passed through states in the manipulated state variable of the optical element. In the case of a positional change by translation in space, the travel is a path in three-dimensional space. In the case of an application of heat and/or coldness to the optical element, a travel can, for example, be defined by a temporal succession of successively assumed temperature states.

The generation of the travel generating optimization algorithm is effected on the basis of at least one predetermined imaging parameter, more particularly an imaging parameter set, which includes information with respect to the mask structures and/or information with respect to an illumination stetting for an upcoming exposure process. In general terms, the manipulator changing model is created on the basis of structure information with respect to mask structures to be imaged and/or structure information with respect to an angular distribution of the exposure radiation radiated onto the mask. The angular distribution of the exposure radiation radiated onto the mask is also referred to as "illumination calibration" or "illumination setting" below. By way of example, the structure information with respect to the mask structures to be imaged can include a line width, a characterization of the geometric structure of the mask structures, an orientation of structures in the core region and/or the periphery of a semiconductor chip. Examples of frequently used illumination settings include annular illumination, dipole illumination and quadrupole illumination.

As a result of the generation of the travel generating optimization algorithm on the basis of at least one predetermined imaging parameter, the optimization algorithm can be adapted so well to the characteristic of the subsequent exposure process that the optimization algorithm makes do with comparatively few computational operations. As a result, it becomes possible to provide travel signals for the at least one manipulator during the exposure process at short time intervals, as a result of which the aberration characteristic of the projection lens can be corrected with great accuracy. Here, it is not necessarily all aberration parameters that are corrected uniformly, but rather those are corrected in a targeted fashion which are relevant to the at least one imaging parameter.

In accordance with one embodiment, the projection exposure apparatus includes a storage device for storing a set of aberration parameters which in general terms define the imaging quality of the projection lens. In accordance with a further embodiment, the optimization algorithm is configured to set the at least one travel so that, in the case of a corresponding actuation of the manipulator, a subset of the aberration parameters is optimized. Here the subset, also referred to as "selected subset" below, is in particular reduced compared to the complete set of aberration parameters by at least one aberration parameter, the influence of which on the imaging behaviour of the projection exposure apparatus in the predetermined imaging parameter is less than the respective influence of the remaining aberration parameters. In doing so, this does not preclude the residual subset from likewise experiencing an optimization. However, in this case the selected subset is particularly optimized, i.e., optimized to a greater extent, than the residual subset. By way of example, this can be implemented by virtue of the regions of the wavefronts scanned by the core-region structures being intended to satisfy tighter specific properties with respect to the imaging behaviour than the regions of the wavefronts scanned by the peripheral structures. By way of example, aberration parameters can be Zernike coefficients, weighted sums of Zernike coefficients, lithographic variables such as, e.g., a lithographically measured astigmatism or a lithographically measured coma aberration, imaging variables such as overlay, variation of the best focus and/or fading effects. The definition of such effects is provided in, for example, pages 30-33 of WO 2010/034674 A1.

As opposed to the peripheral structures, the core-region structures are defined on the mask. Here, the core-region structures are those structures that are imaged with a sufficiently small pitch or with the smallest pitch. The sufficiently small pitch is defined by virtue of the fact that those structures whose pitch is less than or equal to the sufficiently small pitch make up at least 5%, in particular at least 10%, at least 50% or at least 80% of all structures situated on the mask to be imaged. The peripheral structures are then all structures which are not core-region structures. It was found that, in general, the core-region structures react sensitively to small changes in specific regions of the wavefront, whereas these are insensitive to relatively large changes in other regions. Here, a high sensitivity leads to high yield losses in the production of the corresponding semiconductor chips.

By reducing the set of optimized aberration parameters or the set of especially optimized aberration parameters to the aforementioned subset, it becomes possible to establish a manipulator correction, adapted in a targeted fashion to the imaging process, in a particularly short time and simple fashion. The set of aberration parameters by which the imaging quality of the projection lens is determined merely includes aberration parameters whose influence on the imaging quality is significant for the purpose of the projection lens. In accordance with one embodiment, those aberration parameters have a significant influence on the imaging quality which, overall, make up at least 50%, in particular at least 90%, at least 95% or at least 99% of a lithographic error observed overall in core-region structures. Here, as already mentioned previously, lithographic error observed overall is understood to mean, for example, a coma aberration, an overlay error, variations of the best focus and/or fading effects in the core-region structures. In particular, the aforementioned set includes those aberration parameters which are optimized by conventional optimization methods.

In accordance with a further embodiment, the travel generating optimization algorithm is configured to establish the travel for the manipulator actuation on the basis of at least one aberration parameter which characterizes the imaging quality of the projection lens. Here, the travel is established in such a way that the imaging quality is improved in the case of a change of the corresponding state variable of one of the optical elements along the travel.

In accordance with a further embodiment, the travel generating optimization algorithm is based on a mathematical model with at most 1000, in particular at most 500, at most 250, at most 100, at most 60, at most 40 or at most 25 basis functions. Such a model renders it possible to generate current travel commands within a short period of time. In accordance with one embodiment, the travel establishing device is configured to establish the at least one travel in less than 500 ms, in particular less than 100 ms or less than 20 ms. In accordance with one embodiment configured for an EUV projection exposure apparatus, the travel is established in less than 30 seconds, in particular less than 10 seconds. In accordance with a further embodiment, the travel generating algorithm is configured to carry out matrix multiplications and, in particular, uses as a basis a singular value decomposition or a Tikhonov regularization, in particular with forming an inverse.

In accordance with a further embodiment, the algorithm generator has a database with a plurality of different stored algorithms. In accordance with one variant, the algorithm generator is configured to select one of the stored algorithms as travel generating optimization algorithm on the basis of the predetermined imaging parameter.

In accordance with a further variant, the algorithm generator is configured to adapt a stored algorithm stored in the algorithm generator to the predetermined at least one imaging parameter. The stored algorithm can be an algorithm which is already adapted to a certain degree to the predetermined imaging parameter. This can be an algorithm which was optimized in preliminary fashion at an earlier time or an algorithm which is partly or wholly adapted to a similar imaging parameter. Alternatively, it is also possible to use a standard algorithm which is not specifically adapted to an imaging parameter. In accordance with a further embodiment, the algorithm generator is configured to effect the adaptation of the stored algorithm to the predetermined imaging parameter by carrying out an optimization method. To this end, the algorithm generator in particular includes a so-called algorithm optimizer.

In accordance with a further embodiment, the optimization method serving to adapt the stored algorithm is based upon a merit function, which takes into account the influence of a change in the imaging quality of the projection lens due to lens-element heating, also referred to as "lens heating", directly or indirectly during the exposure process on at least one lithographic error. That is, the influence of the above specified change on at least one lithographic mirror is taken into account. Here, a lithographic error should be understood to mean an error which occurs during lithographic imaging, such as, for example, a so-called overlay error. An overlay error specifies a local image-position displacement of an imaged mask structure compared to the intended position thereof on the substrate. The imaging quality can be influenced indirectly by way of, for example, suitable weightings on odd Zernike coefficients or weighted linear combinations of odd Zernike coefficients if use is made of a manipulator changing model based on the method of least squares. Thus, for example, such a manipulator changing model can be based on singular value decomposition or Tikhonov regularization.

In accordance with a further embodiment, the travel establishing device is configured to activate, in an exposure pause, a travel generating optimization algorithm, which is newly generated by the algorithm generator, and therefore use it for establishing the travel from the activation time onward. An exposure pause can be a pause during which a batch interchange is carried out. A batch is understood to mean wafers exposed as packet, which are generally exposed with uniform illumination parameters, i.e., with the same mask and the same illumination setting. An exposure pause serving to activate the optimization algorithm can also be the short period of time between the end of the exposure of a preceding wafer and the start of the exposure of the next wafer. This period of time can also be used for measuring purposes.

In accordance with a further embodiment, the projection exposure apparatus includes a sensor for measuring an external physical variable, and the travel establishing device is configured to take into account the external physical variable when establishing the travel. In particular, there is a continuous adaptation of the travel to the physical variable. An example of such a physical variable is the surrounding air pressure.

In accordance with a further embodiment, the projection exposure apparatus includes a simulation device, which is configured to simulate changes in the optical properties of the optical elements, which changes occur as the result of heating of the optical elements, for example on the basis of the radiation effect during the exposure process or due to additional lens-element heating for achieving an optimum operating temperature with respect to the material quality in the case of EUV projection exposure apparatuses. Here, the optimization algorithm is configured to calculate the at least one travel on the basis of the simulated heating-induced changes in the optical properties.

In accordance with a further embodiment, the projection exposure apparatus is configured to successively image the mask structures respectively onto different regions of the substrate in a plurality of exposure steps and the travel establishing device is configured to establish an updated version of the at least one travel after every exposure step. In other words, the travel is updated after every exposed field.

In one aspect, the disclosure provides a method for operating a projection exposure apparatus for microlithography. The apparatus includes a projection lens having a plurality of optical elements for imaging mask structures onto a substrate during an exposure process. The method includes predetermining at least one imaging parameter for a subsequent exposure process. The imaging parameter includes structure information with respect to the mask structures to be imaged and/or structure information with respect to an angular distribution of exposure radiation radiated onto the mask structures. The method also includes generating a travel generating optimization algorithm adapted to the predetermined imaging parameter on the basis of the at least one predetermined imaging parameter. The method further includes establishing at least one travel for at least one of the optical elements via the travel generating optimization algorithm. The travel defines a change of a state variable of the at least one optical element. In addition, the method includes actuating the at least one optical element along the predetermined travel by changing the state variable.

In accordance with one embodiment, the travel generating optimization algorithm, adapted to the predetermined imaging parameter, is generated by the projection exposure apparatus. In accordance with an alternative embodiment, the travel generating optimization algorithm, adapted to the predetermined imaging parameter, is generated outside of the projection exposure apparatus and, after it has been generated, is read into the projection exposure apparatus. It is optionally possible to provide the user with the option of approving the optimization algorithm or activating it after reading in the adapted optimization algorithm. In accordance with one variant, the projection exposure apparatus can have an algorithm generator to which an imaging parameter and/or a travel generating algorithm are/is transmitted by the user.

In accordance with a further embodiment, at least one control parameter defining the adapted optimization algorithm is generated outside of the projection exposure apparatus and, after it has been generated, is read into the projection exposure apparatus. The optimization algorithm has one or more merit functions, as well as constraints. Control parameters of the aforementioned type denote those parameters which, in the case of the same initial state, change one or more of the merit functions or one or more of the constraints.

The features specified with respect to the embodiments, listed above, of a projection exposure apparatus can be correspondingly applied to a method. Conversely, the features specified with respect to the embodiments, listed above, of a method according can be correspondingly applied to a projection exposure apparatus.

BRIEF DESCRIPTION OF THE DRAWINGS

The above and further advantageous features of the disclosure are illustrated in the following detailed description of exemplary embodiments with reference to the accompanying schematic drawings, in which:

FIG. 2 is a flowchart which depicts an embodiment of the functionality of the algorithm generator.

DETAILED DESCRIPTION OF EXEMPLARY EMBODIMENTS

Figure 1:
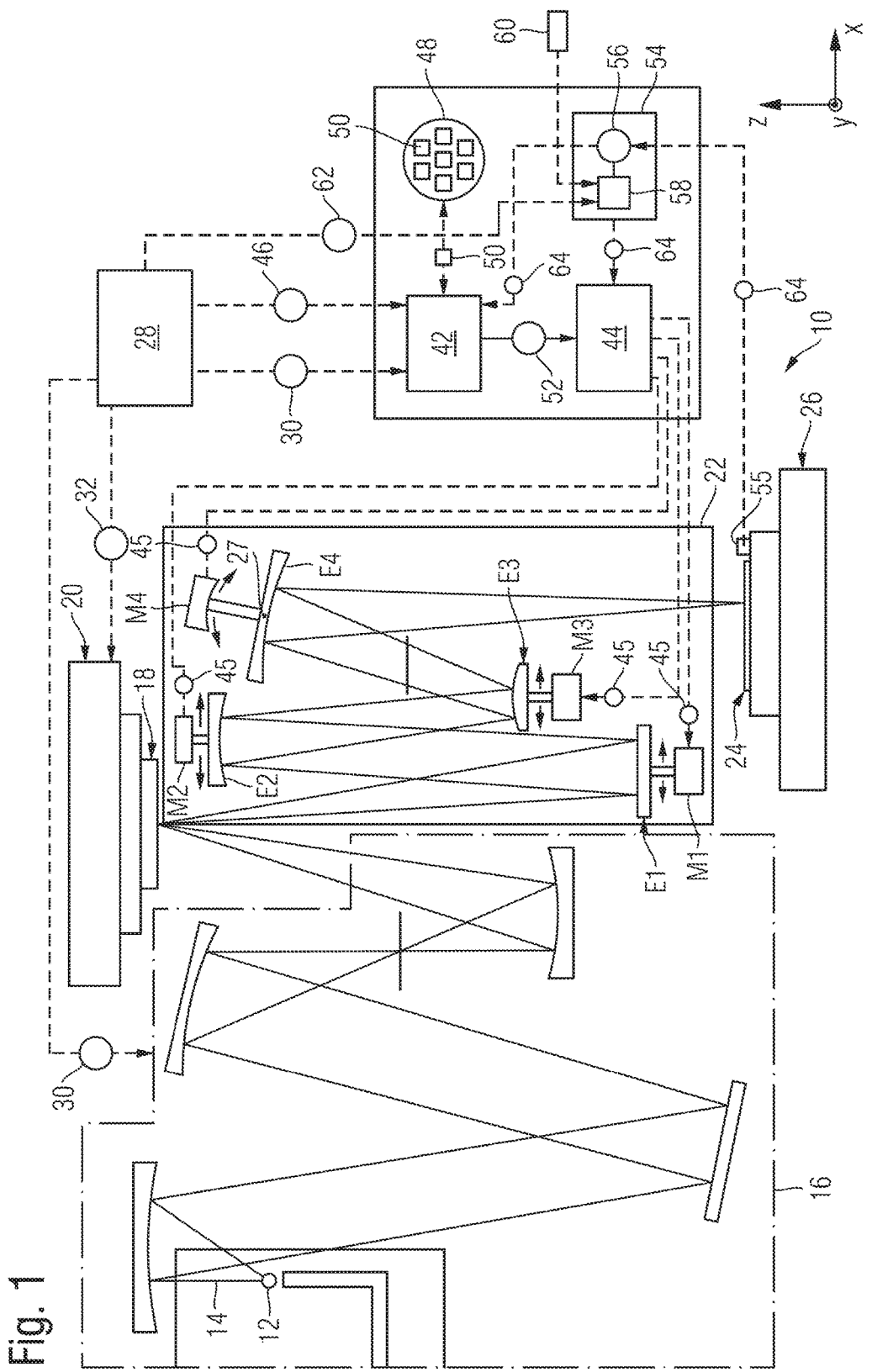
FIG. 1 depicts an embodiment of a projection exposure apparatus for microlithography with an algorithm generator for generating a travel generating optimization algorithm.

In the exemplary embodiments described below, elements which are functionally or structurally similar to one another are as far as possible provided with the same or similar reference signs. Therefore, for understanding the features of the individual elements of a specific exemplary embodiment, reference should be made to the description of other exemplary embodiments or the general description of the disclosure.

To facilitate the description of the projection exposure apparatus, a Cartesian xyz-coordinate system is indicated in the drawing, which system reveals the respective positional relationship of the components illustrated in the figures. In FIG. 1, the y-direction runs perpendicularly to the plane of the drawing out of the latter, the x-direction runs towards the right and the z-direction runs upwards.

FIG. 1 shows an embodiment of a projection exposure apparatus 10 for microlithography. The embodiment is designed for operation in the EUV wavelength range, i.e. with electromagnetic radiation with a wavelength of less than 100 nm, in particular a wavelength of approximately 13.5 nm or approximately 6.7 nm. As a result of this operating wavelength, all optical elements are embodied as mirrors. However, the disclosure is not restricted to projection exposure apparatuses in the EUV wavelength range. Further embodiments according to the disclosure are designed, for example, for operating wavelengths in the UV range, such as e.g. 365 nm, 248 nm or 193 nm. For such embodiments, at least some of the optical elements are configured as conventional transmission lenses.

The projection exposure apparatus 10 in FIG. 1 includes an exposure radiation source 12 for generating exposure radiation 14. In the present case, the exposure radiation source 12 is embodied as an EUV source and can, for example, include a plasma radiation source. The exposure radiation 14 first of all passes through an illumination optical unit 16 and is directed onto a mask 18 from the latter. The illumination optical unit 16 is configured to generate different angular distributions of the exposure radiation 14 incident on the mask 18. Depending on an illumination adjustment, also referred to as "illumination setting", desired by the user, the illumination optical unit 16 configures the angular distribution of the exposure radiation 14 incident on the mask 18. Examples of selectable illumination settings include a so-called dipole illumination, annular illumination and quadrupole illumination.

The mask 18 has mask structures for imaging a substrate 24 and is displaceably mounted on a mask displacement stage 20. The mask 18 can be embodied as a reflection mask, as illustrated in FIG. 1, or alternatively, in particular for UV lithography, also be configured as a transmission mask. In the embodiment in FIG. 1, the exposure radiation 14 is reflected at the mask 18 and thereupon passes through a projection lens 22, which is configured to image the mask structures on the substrate 24. The substrate 24 is displaceably mounted on a substrate displacement stage 26. The projection exposure apparatus 10 can be embodied as a so-called scanner or as a so-called stepper. The exposure radiation 14 is routed within the illumination optical unit 16 and within the projection lens 22 via a multiplicity of optical elements, which are shown as mirrors in FIG. 1.

In FIG. 1, the projection lens merely has four optical elements E1 to E4. All optical elements are mounted in a movable fashion. Moreover, a respective manipulator M1 to M4 is associated with each of the optical elements E1 to E4. Each manipulator M1, M2 and M3 enables a displacement of its respective optical elements E1, E2 and E3 in the x- and y-direction and hence a displacement substantially parallel to the plane in which the respective reflective surface of the optical element lies.

The manipulator M4 is configured to tilt the optical element E4 by rotation about a tilt axis 27 which is arranged parallel to the y-axis. As a result, the angle of the reflecting surface of E4 is changed with respect to the incident radiation. Further degrees of freedom for the manipulators are feasible. Thus, for example, provision can be made for a transverse displacement of the relevant optical element with respect of the optical surface thereof, or a rotation about a reference axis perpendicular to the reflecting surface.

In general terms, each of the manipulators M1 to M4 is provided for effecting a displacement of the associated optical element E1 to E4 by performing a rigid body movement along a predetermined travel. By way of example, such a travel can combine translations in different directions, tilts and/or rotations in arbitrary fashion, or else can consist of a different natured change in a state variable of the associated optical element by corresponding actuation of the manipulator.

The projection exposure apparatus 10 furthermore includes a central control device 28. The central control device 28 controls the various components of the projection exposure apparatus 10 when carrying out an exposure process. In order to prepare an exposure process, the central control device 28 transmits mask-selection information 32 to the mask displacement stage 20. The mask displacement stage 20 thereupon takes the mask desired for the subsequent exposure process from a mask library and loads the mask into the exposure position.

Furthermore, the central control device 28 transmits illumination setting information 30 to the illumination optical unit 16. The illumination setting information 30 defines the angular distribution with respect to the exposure radiation 14 radiated onto the mask, desired for the subsequent illumination process. As already mentioned above, this angular distribution is often also referred to as "illumination setting". The illumination optical unit 16 undertakes corresponding settings of the desired illumination setting.

The projection exposure apparatus 10 furthermore includes a manipulator control 40 for controlling the manipulators M1 to M4. The manipulator control 40 in turn includes an algorithm generator 42 and a travel establishing device 44. The algorithm generator 42 is configured to generate a travel generating optimization algorithm 52 and transmit the latter to the travel establishing device 44. The travel establishing device 44 uses the travel generating optimization algorithm 52 for establishing control signals which serve to control the manipulators M1 to M4, as will be described in more detail below. The central control device 28 provides the algorithm generator 42 with an imaging parameter set with respect to an upcoming exposure process.

In accordance with one embodiment variant, the algorithm generator 42 can also be arranged outside of the projection exposure apparatus 10. The manipulator control 40 in this case includes a read-in device for reading in the travel generating optimization algorithm 52. Alternatively, it is also possible that only control parameters of the optimization algorithm 52 are generated outside of the projection exposure apparatus 10 and transmitted to the manipulator control 40.

The imaging parameter set includes at least one item of structure information with respect to the mask structures to be imaged and/or structure information with respect to the illumination setting. In accordance with one embodiment, the imaging parameter set includes illumination setting information 30 and mask structure information 46. Within the scope of this application, such an imaging parameter set is also referred to as "usage configuration". The illumination setting information 30 identifies the angular distribution of the exposure radiation 14 radiated onto the mask 18. The mask structure information 46 can include a precise geometric reproduction of the mask structures to be imaged, or else only specify essential structure aspects of same, such as e.g. line width, characterization of the geometric structures of the mask structures, orientation of mask structures, for example differentiated with respect to central structures and peripheral structures.

In the following text and with reference to FIG. 2, an embodiment according to the disclosure of the procedure of the algorithm generator 42 for generating the travel generating optimization algorithm 52 will be described on the basis of the imaging parameters, provided by the central control device 28, in the form of the illumination setting information 30 and the mask structure information 46.

First of all, the algorithm generator 42 accesses a database 48, in which a multiplicity of stored algorithms 50, which are adapted to different imaging parameter sets, are stored. The algorithm generator 42 initially checks whether the database 48 already contains a stored algorithm 50 which is adapted to the predetermined imaging parameters.

If a suitably adapted stored algorithm 50 is available in the database 48, the algorithm generator 42 transmits the former to the travel establishing device 44 as travel generating optimization algorithm 52. If this is not the case, the algorithm generator 42 selects one of the stored algorithms 50 from the database 48 as a start algorithm for a subsequent optimization method. The start algorithm can either be a general standard algorithm, or else an algorithm which is optimized with respect to an imaging parameter set which comes close to the predetermined imaging set. Furthermore, the database 48 can also have a stored algorithm 50 which is already optimized in a preliminary fashion to the predetermined imaging parameter set. In this case, the algorithm generator 42 can select this algorithm as start algorithm.

In order to adapt the selected start algorithm to the predetermined imaging parameters, a load parameter collection is initially established in a step S1. This load parameter collection represents a collection of aberration parameter sets, which are expected to occur during the operation of the projection lens 22. The aberration parameter sets are also referred to as "load cases". When generating the aberration parameter sets, changes in the aberration parameters as a result of thermal effects in the form of lens-element heating during the exposure process are initially taken into account.

The aberration parameter sets describe the imaging quality of the projection lens 22 and, in accordance with one embodiment, include a set of Zernike coefficients. A set of measured aberration parameters in the form of Zernike coefficients, stored in a storage device 56, is firstly retrieved in step S1. Thereupon changes in the imaging parameter set, which are expected to occur during the upcoming exposure process as a result of lens-element heating and optionally other deterministic operational-dependent influences, are established by simulation. These changes are determined dependent on the imaging parameters predetermined for the upcoming exposure step. In other words, the characteristic of the lens-element heating and optional other deterministic operational-dependent influences under the predetermined imaging parameters are calculated in a targeted fashion during the simulation and the changes in the imaging parameter set resulting therefrom are established. All imaging parameter sets occurring during the duration of the upcoming exposure process form the aforementioned load parameter collection.

Thereupon, the load parameter collection is complemented in step S2 by further aberration parameter sets that are expected to occur. Examples of such complements include modifications of the aberration parameters in the case of changing air pressure, influences of elementary image aberrations, such as e.g. scale errors and/or aberration parameter changes, which occur during the imaging of general relevant structures. These complementary aberration parameter sets in particular include load cases which are independent of the illumination setting and can be interpreted as "basic requirements" for the correction capability of the projection lens.

In the now following step S3, respective conversion parameter sets are established for converting the aberration parameter sets of the load parameter collection into lithographic errors. "Lithographic errors" are understood to be errors of the projection lens, which can be measured in the lithographic image, i.e. in the aerial image present in the substrate plane or in the structure generated on the substrate 24 by the lithographic imaging on the photoresist. Such lithographic errors are also referred to as imaging parameter errors and are in contrast to wavefront aberrations, which cannot be measured directly in the lithographic image. An example of such a lithographic error is a so-called "overlay error". As already mentioned above, the overlay error represents a local image position displacement of an imaged mask structure compared to the intended position thereof on the substrate.

The conversion parameter sets established as per step S3 render it possible to convert the aberration parameter sets into selected lithographic errors, in particular overlay errors. The established conversion parameter sets are generally available in the form of linear factor datasets. Such linear factor datasets can be represented by matrices which, field point by field point, convert the Zernike coefficients characterizing the wavefront into lithographic error variables.

Thereupon a merit function for an optimization method for generating an optimized travel generating optimization algorithm 52 is generated in a step S4. The merit function is designed in such a way that selected lithographic errors, in particular overlay errors, receive suitable weighting for the subsequent optimization.

Thereupon, the travel generating optimization algorithm 52 is determined in a step S5 by optimization on the basis of the merit function generated in step S4. As already explained above, the travel generating optimization algorithm is, as per one variant, created on the basis of singular value decomposition or Tikhonov regularization. Here, the Tikhonov weightings or the singular value parameters, for example, are released for optimization, with the stipulation that the properties of the load cases are satisfied to the best possible extent. The stored algorithm 50 taken from the database, which can either be a standard algorithm or an algorithm already optimized in a preliminary fashion, serves as a start algorithm, as mentioned previously. For the optimization method used in the process, use can be made of various basic algorithms known to a person skilled in the art, for example simulated cooling, also known as "simulated annealing", genetic algorithms and/or evolutionary algorithms and convex programming, in particular sequential quadratic programming (SQP). With respect to the latter methods, reference is made to Stephen Boyd, Lieven Vandenbergh, "Convex Optimization", Cambridge University Press (2004), chapter 4.4, pages 152-153, chapter 4.6, page 167, chapter 4.7, pages 174-184, chapters 11.1-11.5, pages 561-596, and chapter 11.8, pages 615-620, and also to Walter Alt, "Nichtlineare Optimierung" [Nonlinear optimization], Vieweg, 2002, chapter 8, pages 291-305.

The travel generating optimization algorithm 52 generated by the algorithm generator 42 is transmitted to the travel establishing device 44 and stored in the database 48 as further stored algorithm. The optimization algorithm 52 is used by the travel establishing device 44 to determine travels 45 for the individual manipulators M1 to M4. The travels 45 define changes to be carried out in the corresponding state variables of the optical elements E1 to E4. The established travels 45 are transmitted to the individual manipulators M1 to M4 via travel signals and predetermine correction travels respectively to be carried out by these. These define corresponding displacements of the associated optical elements E1 to E4 for correcting wavefront aberrations of the projection lens 22 which have occurred. In order to establish the travels 45, the travel establishing device 44 obtains respectively updated aberration parameters 64 of the projection lens 22 while carrying out the exposure process. These aberration parameters 64 can, for example, include the wavefront characterizing Zernike coefficients.

The travel generating optimization algorithm 52 generated by the algorithm generator 42 is adapted to the imaging parameter set utilized in the exposure process, i.e. in particular to the illumination setting and the utilized mask structures, in such a way that the travel can be established without delays that interfere with the exposure process. Thus, the travel establishing device 44 as per one embodiment which is designed for operating projection exposure apparatuses in the UV wavelength range generates updated travels 45 a number of times per second, for example every 100 milliseconds, and therefore updates travels in real time. Updating the travels a number of times per second for example renders it possible to readjust the manipulators after every field exposure. In an embodiment adapted for EUV projection exposure apparatuses, it is optionally possible to allow longer periods of time to pass between the updates, for example 30 seconds.

The optimization algorithm 52 is based on a mathematical model with at most 1000 basis functions. In accordance with various embodiments, the optimization algorithm is based on at most 400, at most 100 or at most 60 basis functions. In accordance with one embodiment, the travels 44 are established by matrix multiplications with an inverse matrix calculated in advance, as is possible, for example, in the case of an approach on the basis of the singular value decomposition or Tikhonov regularization. In this case, m×n is supposed to be the matrix size. From this, m·n matrix multiplications follow, where m is typically formed from the product of the specified number of Zernike coefficients and the number of measured field points. Examples for the specified number of Zernike coefficients include 36, 49, 64 or 100 Zernike coefficients, while a value of between 30 and 100 is suitable for the number of measured field points. If the Zernike coefficient Z1 is ignored, the specified values with respect to the Zernike coefficients reduce by one. The parameter "n" represents the number of the overall possible degrees of freedom of the manipulator. By way of example, if 49 Zernike coefficients are measured or simulated or extrapolated at respectively 65 field points, and 52 degrees of freedom are allowed for the manipulators, this results in 165 620 matrix multiplications for generating the travels 45.

The optimization algorithm 52 can be based on algorithms which are well known to a person skilled in the art, e.g. on singular value decomposition, also referred to as "SVD", and/or Tikhonov regularization. In both cases, the problem is reduced to carrying out a matrix multiplication of the form x=Ap by calculating an inverse matrix or a pseudo-inverse matrix. Here, x is the change of the manipulator manipulated vector, p is the interference to be corrected and A is a suitable matrix, in general the suitably regularized inverse of a sensitivity matrix.

The regularly updated aberration parameters of the projection lens 22 are transmitted to the travel establishing device 44 by an aberration parameter transmitter 54. The aberration parameter transmitter 54 has a storage device 56 and a simulation device 58. Aberration parameters 64 are stored in the storage device 56, which parameters were established using a wavefront measurement at the projection lens 22. These measurement results can be collected using an external wavefront measuring instrument. However, alternatively, the aberration parameters 54 can also be measured by a wavefront measurement device 55 integrated in the substrate displacement stage 26. By way of example, such a measurement can be taken regularly after each exposure of a wafer or respectively after exposing a complete wafer set. Alternatively, a simulation or a combination of simulation and reduced measurement can be undertaken instead of a measurement.

The measured values of the aberration parameters 64 stored in the storage device 56 are optionally adapted to respective updated conditions during the exposure process by the simulation device 58. In accordance with one embodiment, the current radiation intensity 62 is to this end regularly transmitted to the simulation device 58 by the central control device 28. From this, the simulation device 58 calculates changes in the aberration parameters 64 effected due to lens-element heating on the basis of the respective illumination setting. Furthermore, the simulation device continuously obtains measurement values from a pressure sensor 60 which monitors the pressure surrounding the projection exposure apparatus 10. Effects of changes in the surrounding pressure on the aberration parameters 64 are taken into account by the simulation apparatus 58.

The generation and use of a travel generating optimization algorithm 52 is automatically monitored by a suitable entity. In the case of irregularities, a switch is made to emergency operation on the basis of a standard optimization algorithm which is suitable for a multiplicity of imaging parameter sets. Irregularities can be detected on the basis of the analysis of travel commands or the analysis of residual wavefronts. Thus, for example, a malfunction and hence the presence of irregularities can be deduced from observing oscillating travel commands.

The optimization of a stored algorithm in the algorithm generator 42 with respect to an imaging parameter set, described on the basis of FIG. 2, can also occur during an exposure break or else during the imaging operation of the projection exposure apparatus 10. Thus, for example, the exposure operation can initially be started with a travel generating standard algorithm, and a stored algorithm can be adapted to the utilized imaging parameter set during the operation. When the adapted optimization algorithm is completed, the latter is then taken up by the travel establishing device 44 during an exposure pause.

In some embodiments, various implementations of the systems and methods described here can be realized in computing devices such as digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

LIST OF REFERENCE NUMERALS

10 Projection exposure apparatus
12 Exposure radiation source
14 Exposure radiation
16 Illumination optical unit
18 Mask
20 Mask displacement stage
22 Projection lens
24 Substrate
26 Substrate displacement stage
E1, E2, E3, E4 Optical elements
M1, M2, M3, M4 Manipulators
27 Tilt axis
28 Central control device
30 Illumination setting information
32 Mask selection information
40 Manipulator control
42 Algorithm generator
44 Travel establishing device
45 Travel
46 Mask structure information
48 Database
50 Stored algorithm
52 Travel generating optimization algorithm
54 Aberration parameter transmitter
55 Wavefront measuring device
56 Storage device
58 Simulation device
60 Pressure sensor
62 Radiation intensity
64 Aberration parameter

What is claimed is:

1. A system, comprising:
a projection lens for microlithography, comprising a plurality of optical elements configured to image mask structures onto a substrate during an exposure process, the plurality of optical elements comprising a first optical element;
a manipulator configured to change, as part of a manipulator actuation, optical effects of the first optical element in the projection lens by displacing the first optical element by a pre-established displacement along a pre-established trajectory;
a first computing device configured to generate an algorithm based on at least one imaging parameter, the at least one imaging parameter comprising structure information with respect to mask structures to be imaged during an exposure process and/or structure information with respect to an angular distribution of exposure radiation radiated onto the mask structures during the exposure process; and
a second computing device configured to establish the trajectory and the displacement for the manipulator actuation based on the algorithm, the trajectory established by the second computing device corresponding to the pre-established trajectory and the displacement established by the second computing device corresponding to the pre-established displacement for the manipulator actuation.

2. The system of claim 1, wherein the structure information with respect to the mask structures comprises at least one parameter selected from the group consisting of a line width, a characterization of geometric structures of the mask structures, and an orientation of mask structures.

3. The system of claim 1, wherein displacing the first optical element by the pre-established displacement along the pre-established trajectory improves an image quality of the projection lens during the exposure process.

4. The system of claim 1, wherein the second computing device establishes the trajectory and the displacement on the basis of at least one aberration parameter which characterizes an imaging quality of the projection lens.

5. The system of claim 1, wherein the first computing device is programmed to provide the algorithm to the second computing device based on a mathematical model comprising a plurality of basis functions.

6. The system of claim 1, wherein the first computing device is programmed to provide the algorithm to the second computing device retrieved from a database comprising a plurality of stored algorithms.

7. The system of claim 1, wherein the first computing device is programmed to optimize the algorithm to account for a change in an imaging quality of the projection lens during the exposure process.

8. The system of claim 7, wherein the first computing device is programmed to optimize the algorithm to account for heating of an element during the exposure process.

9. The system of claim 7, wherein the first computing device is programmed to optimize the algorithm to account for an effect of the exposure process on at least one lithographic error.

10. The system of claim 9, wherein the at least one lithographic error comprises an overlay error.

11. The system of claim 7, wherein the first computing device is programmed to optimize the algorithm based on a merit function.

12. The system of claim 1, further comprising a sensor for measuring an external physical variable and the trajectory and displacement are established accounting for measurements made using the sensor.

13. The system of claim 12, wherein the external physical variable is an air pressure.

14. A method for manipulating a first optical element in a projection lens comprising a plurality of optical elements configured to image mask structures onto a substrate during an exposure process, comprising:
    generating, using a first computing device, an algorithm based on at least one imaging parameter, the at least one imaging parameter comprising structure information with respect to mask structures to be imaged during an exposure process and/or structure information with respect to an angular distribution of exposure radiation radiated onto the mask structures during the exposure process;
    establishing, using a second computing device, a trajectory and a displacement for a manipulator actuation based on the algorithm, the trajectory established by the second computing device corresponding to a pre-established trajectory and the displacement established by the second computing device corresponding to a pre-established displacement for a manipulator action;
    changing, as part of the manipulator actuation, optical effects of the first optical element in the projection lens by displacing the first optical element by the pre-established displacement along the pre-established trajectory.

15. The method of claim 14, wherein the structure information about the mask structures comprises at least one parameter selected from the group consisting of a line width, a characterization of geometric structures of the mask structures, and an orientation of mask structures.

16. The method of claim 14, wherein displacing the first optical element by the pre-established displacement along the pre-established trajectory improves an image quality of the projection lens during the exposure process.

17. The method of claim 14, wherein the algorithm is optimized to account for heating of an element of the projection lens during the exposure process.

18. The method of claim 14, wherein algorithm is optimized to account for an effect of the exposure process on at least one lithographic error.

19. The system of claim 18, wherein the at least one lithographic error comprises an overlay error.

20. A non-transitory computer-readable storage medium having computer-executable instructions, wherein the computer-executable instructions, when executed by one or more processors cause a manipulation of a first optical element in a projection lens comprising a plurality of optical elements configured to image mask structures onto a substrate during an exposure process, the computer-executable instructions comprising instructions for:
    generating, using a first computing device, an algorithm based on at least one imaging parameter, the at least one imaging parameter comprising structure information with respect to mask structures to be imaged during an exposure process and/or structure information with respect to an angular distribution of exposure radiation radiated onto the mask structures during the exposure process;
    establishing, using a second computing device, a trajectory and a displacement for a manipulator actuation based on the algorithm, the trajectory established by the second computing device corresponding to a pre-established trajectory and the displacement established by the second computing device corresponding to a pre-established displacement for a manipulator action;
    changing, as part of the manipulator actuation, optical effects of the first optical element in the projection lens by displacing the first optical element by the pre-established displacement along the pre-established trajectory.

* * * * *